United States Patent
Hsieh et al.

(10) Patent No.: US 8,199,519 B2
(45) Date of Patent: Jun. 12, 2012

(54) CHIP ADAPTER

(75) Inventors: Ming-Chih Hsieh, Taipei Hsien (TW); Heng-Chen Kuo, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 213 days.

(21) Appl. No.: 12/770,768

(22) Filed: Apr. 30, 2010

(65) Prior Publication Data

US 2011/0249418 A1    Oct. 13, 2011

(30) Foreign Application Priority Data

Apr. 12, 2010  (TW) ............................... 99111271 A

(51) Int. Cl.
*H05K 1/11* (2006.01)
*H01L 23/12* (2006.01)

(52) U.S. Cl. ........ 361/767; 361/784; 361/785; 361/777; 361/794; 439/70; 439/74; 439/65; 439/83; 257/693; 257/697; 257/698; 257/730; 257/737; 29/830; 29/840; 29/845; 29/843; 174/260; 174/261; 174/262; 174/263; 174/264

(58) Field of Classification Search .......... 361/760–767, 361/784–791, 794–796, 813; 174/254–267; 257/690–698, 700, 730–737, 774–783; 439/44, 439/45, 47, 48, 60–66, 70, 74–81, 660, 677, 439/680; 29/825–852
See application file for complete search history.

(56) References Cited

U.S. PATENT DOCUMENTS

| | | | | |
|---|---|---|---|---|
| 5,168,432 A | * | 12/1992 | Murphy et al. | 361/813 |
| 5,515,241 A | * | 5/1996 | Werther | 361/784 |
| 5,903,162 A | * | 5/1999 | Cole et al. | 324/754.11 |
| 6,270,362 B1 | * | 8/2001 | Guran et al. | 439/83 |
| 6,326,560 B1 | * | 12/2001 | Liao | 174/262 |
| 6,407,566 B1 | * | 6/2002 | Brunelle et al. | 324/756.02 |
| 6,664,625 B2 | * | 12/2003 | Hiruma | 257/700 |
| 6,727,116 B2 | * | 4/2004 | Poo et al. | 438/106 |
| 6,818,977 B2 | * | 11/2004 | Poo et al. | 257/685 |
| 6,969,266 B2 | * | 11/2005 | Chu et al. | 439/70 |
| 7,368,814 B1 | * | 5/2008 | Tully et al. | 257/700 |
| 7,388,293 B2 | * | 6/2008 | Fukase et al. | 257/774 |
| 7,633,159 B2 | * | 12/2009 | Boon et al. | 257/730 |

* cited by examiner

*Primary Examiner* — Michail V Datskovskiy

(74) *Attorney, Agent, or Firm* — Altis Law Group, Inc.

(57) ABSTRACT

A chip adapter used to install a chip on a first chip arranging area of a circuit board includes a board. The size of the board has the same size as the first chip arranging area of the circuit board. Edges of the chip adapter define a number of gaps corresponding to first pads of the circuit board. A second chip arranging area of the same size as the chip is arranged in a center of the chip adapter. A number of second pads are arranged around the second chip arranging area of the chip adapter corresponding to pins of the chip. Each second pad is electrically connected to a sidewall of the corresponding gap of the chip adapter.

6 Claims, 8 Drawing Sheets

CHIP ADAPTER

BACKGROUND

1. Technical Field

The present disclosure relates to adapters, and particularly, to a chip adapter used to install a chip on a chip arranging area of a circuit board.

2. Description of Related Art

Generally, chips are installed on chip arranging areas of circuit boards. However, by common manufacturing errors, a chip arranging area of a circuit board may not be the right size for a corresponding chip, consequently, the chip cannot be installed and the circuit board is wasted.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawing in which like references indicate similar elements. It should be noted that references to "an" or "one" embodiment in this disclosure are not necessarily to the same embodiment, and such references mean at least one.

Figure 1:
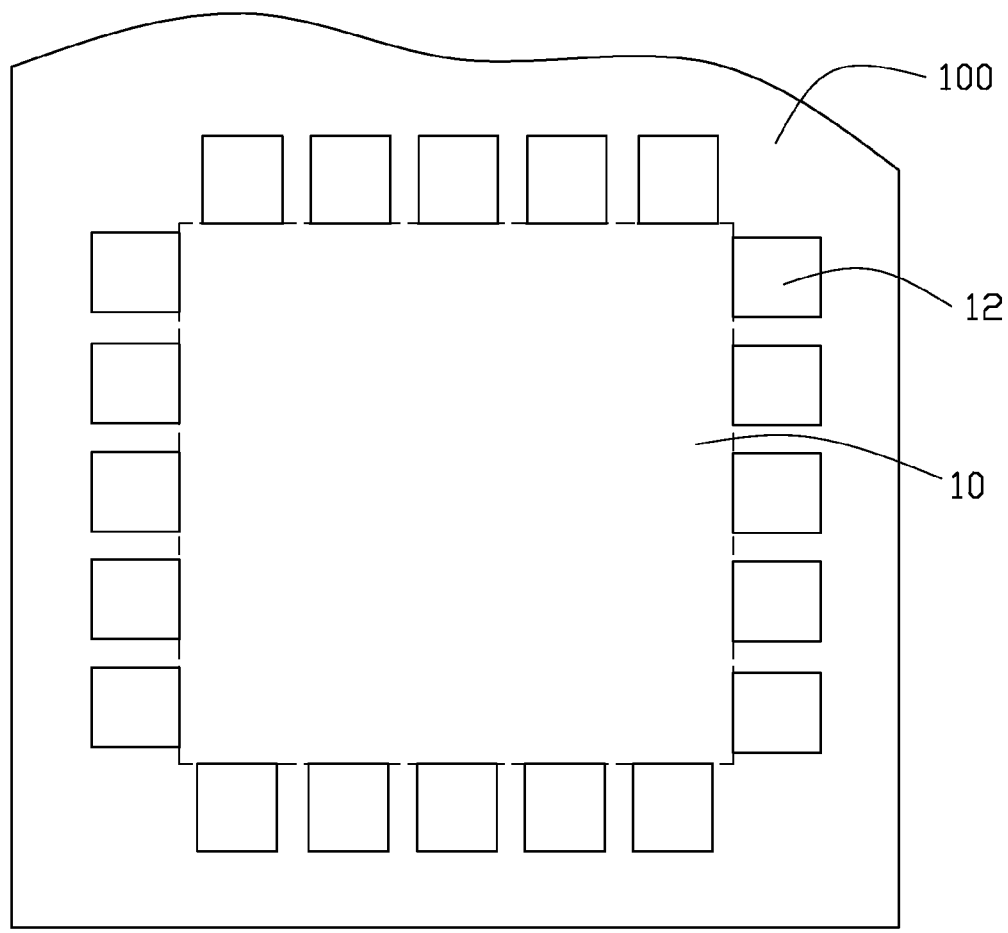
FIG. 1 is a schematic view of a circuit board.
Figure 2:
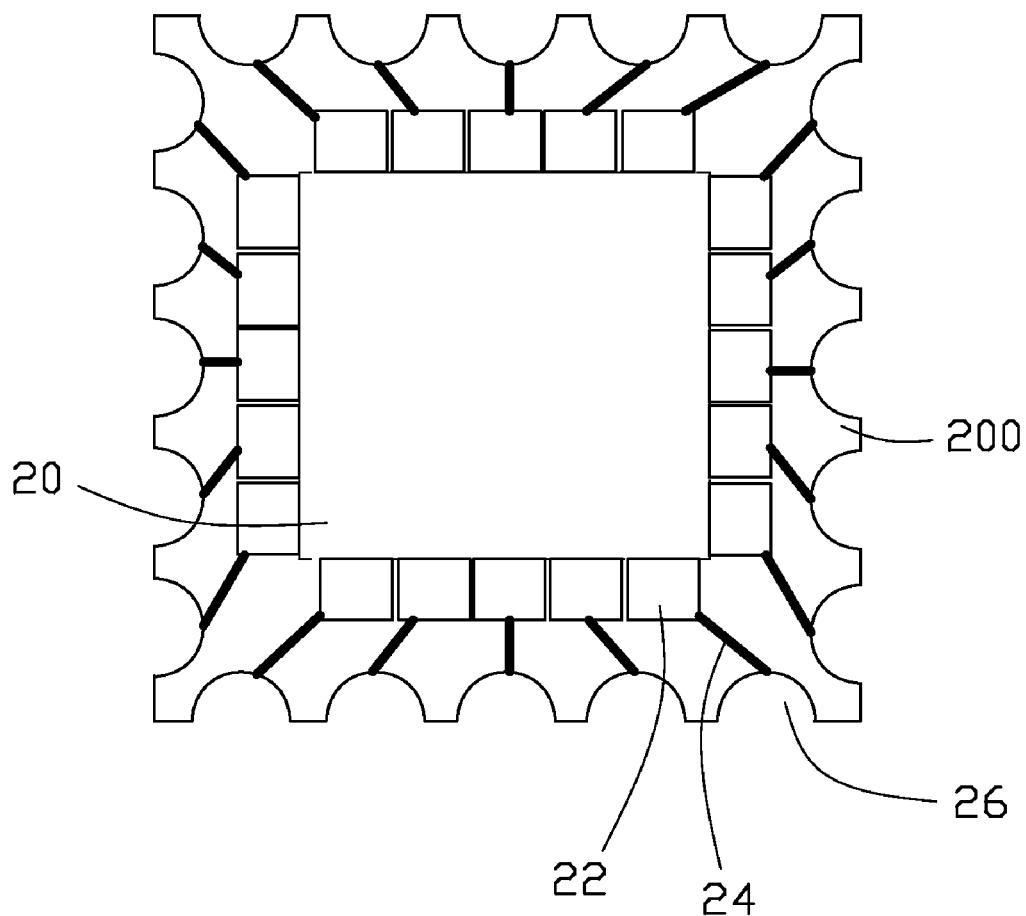
FIG. 2 is a schematic view of a first embodiment of a chip adapter.
Figure 3:
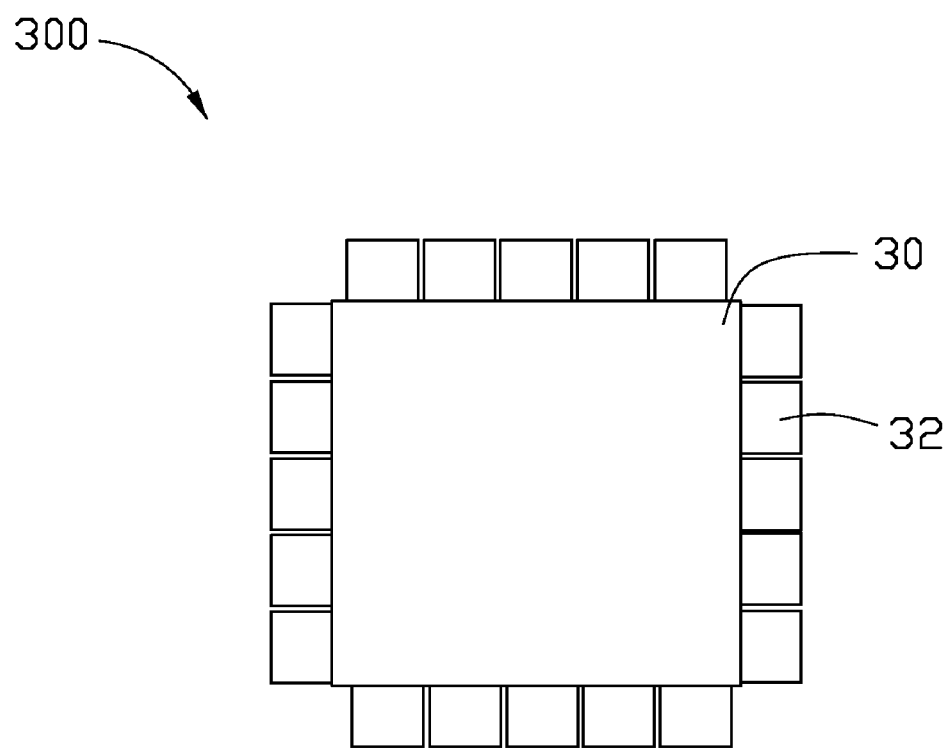
FIG. 3 is a schematic view of a chip.

Referring to FIGS. 1 to 3, a first embodiment of a chip adapter 200 is used to install a chip 300 on a chip arranging area 10 of a circuit board 100. The size of the chip 300 is smaller than the size of the chip arranging area 10, namely the chip 300 cannot be installed on the chip arranging area 10 directly. A plurality of pads 12 are arranged around the chip arranging area 10 of the circuit board 100. A base 30 of the chip 300 extends a plurality of pins 32 corresponding to the plurality of pads 12 of the circuit board 100. The chip adapter 200 is a board of the same size as the chip arranging area 10 of the circuit board 100. Edges of the chip adapter 200 define a plurality of semicircle gaps 26 corresponding to the plurality of pads 12. A chip arranging area 20 of the same size as the base 30 of the chip 300 is arranged in a center of the chip adapter 200. A plurality of pads 22 are arranged around the chip arranging area 20 of the chip adapter 200, corresponding to the plurality of pads 32 of the chip 300. Each pad 22 is electrically connected to a sidewall of the corresponding gap 26, such as by copper traces 24.

Figure 4:
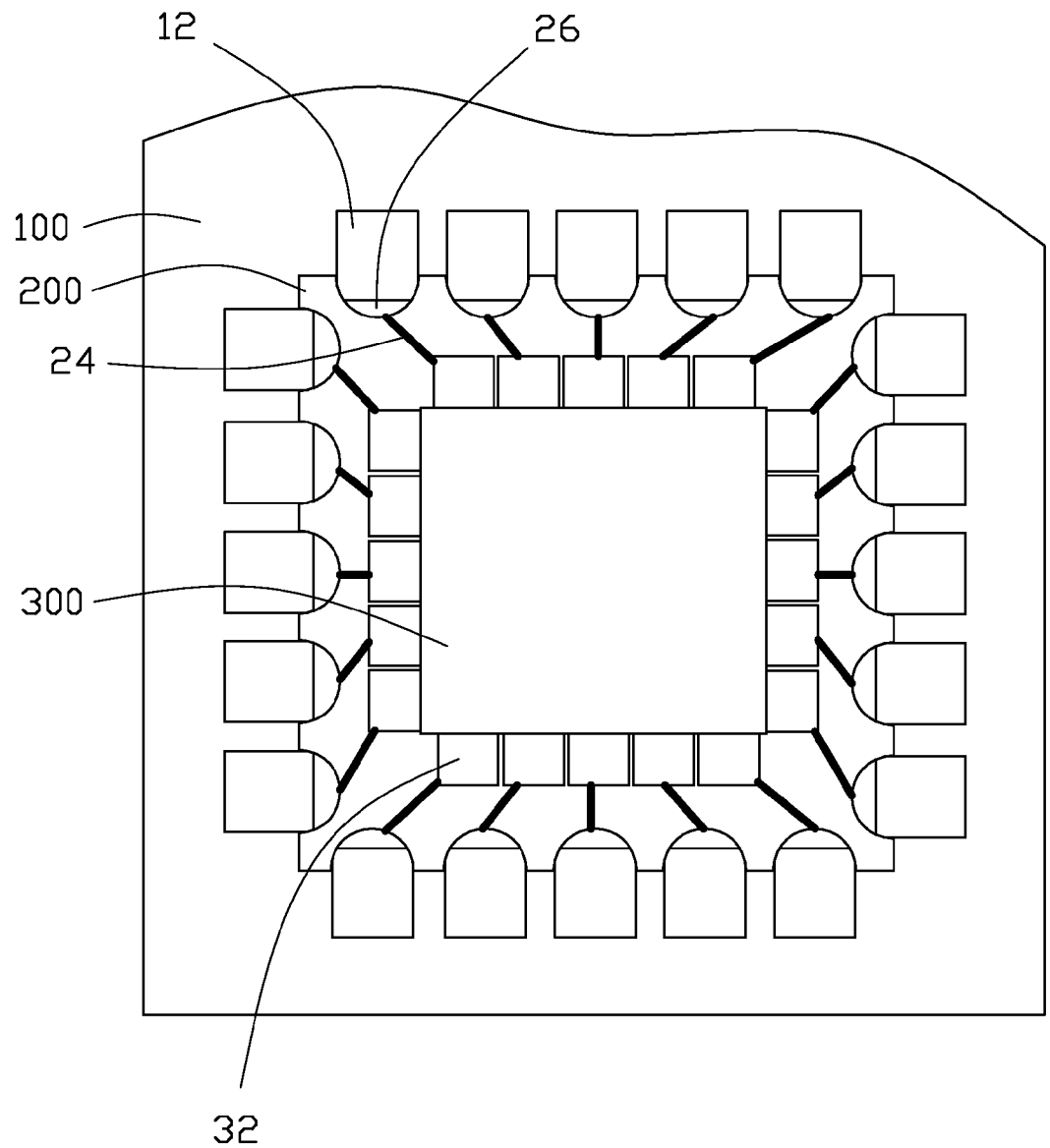
FIG. 4 is a schematic view of the circuit board of FIG. 1, using the chip of FIG. 3 installed using the chip adapter of FIG. 2.

Referring to FIG. 4, in use, the chip adapter 200 is placed on the chip arranging area 10 of the circuit board 100 and each gap 26 of the chip adapter 200 is corresponding to a pad 12 of the circuit board 100. The gaps 26 of the chip adapter 20 are soldered to electrically connect each pad 12 of the circuit board 100 to the corresponding copper trace 24. Therefore, each pad 12 of the circuit board 100 is electrically connected to the corresponding pad 22 of the chip adapter 200 by solder and the corresponding copper trace 24. The chip 300 is placed on the chip arranging area 20 of the chip adapter 200, and each pad 32 of the chip 300 is soldered to the corresponding pad 22 of the chip adapter 200. As a result, each pad 12 of the circuit board 100 is electrically connected to the corresponding pad 32 of the chip 300 through the chip adapter 200, and then the chip 300 can communicate with the circuit board 100.

Figure 5:
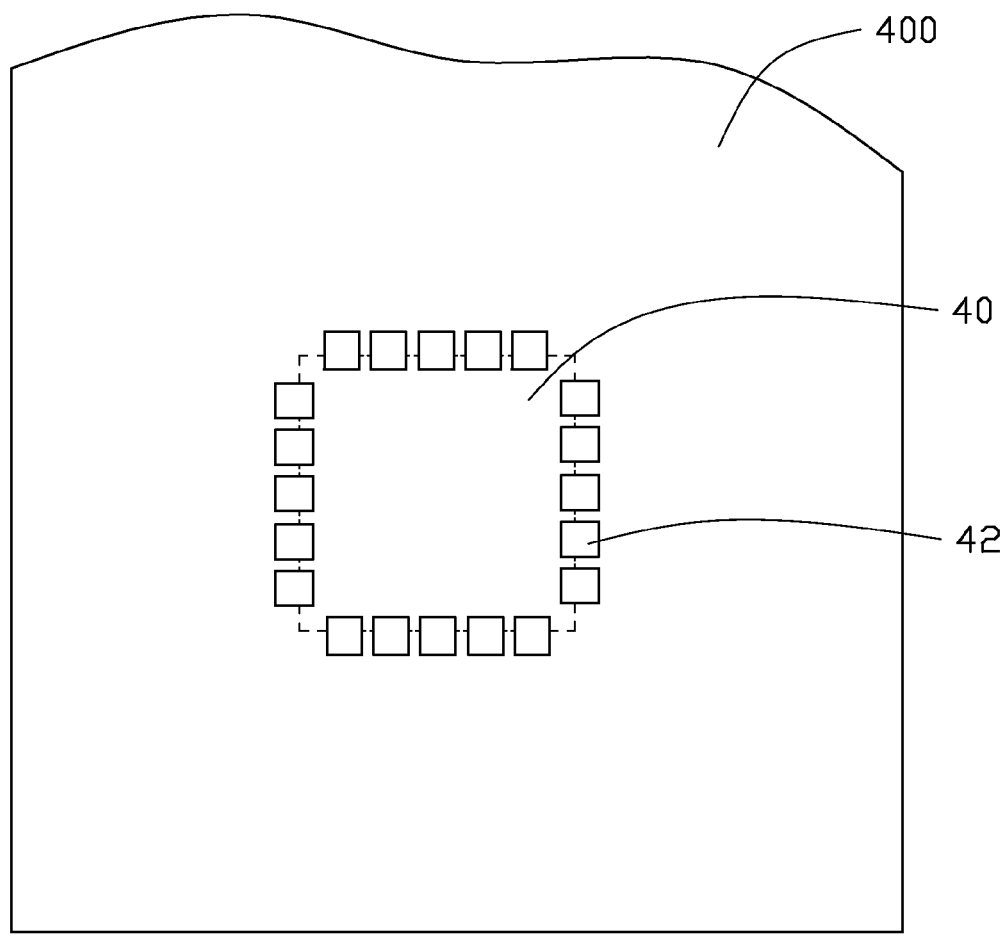
FIG. 5 is a schematic view of another circuit board.
Figure 6:
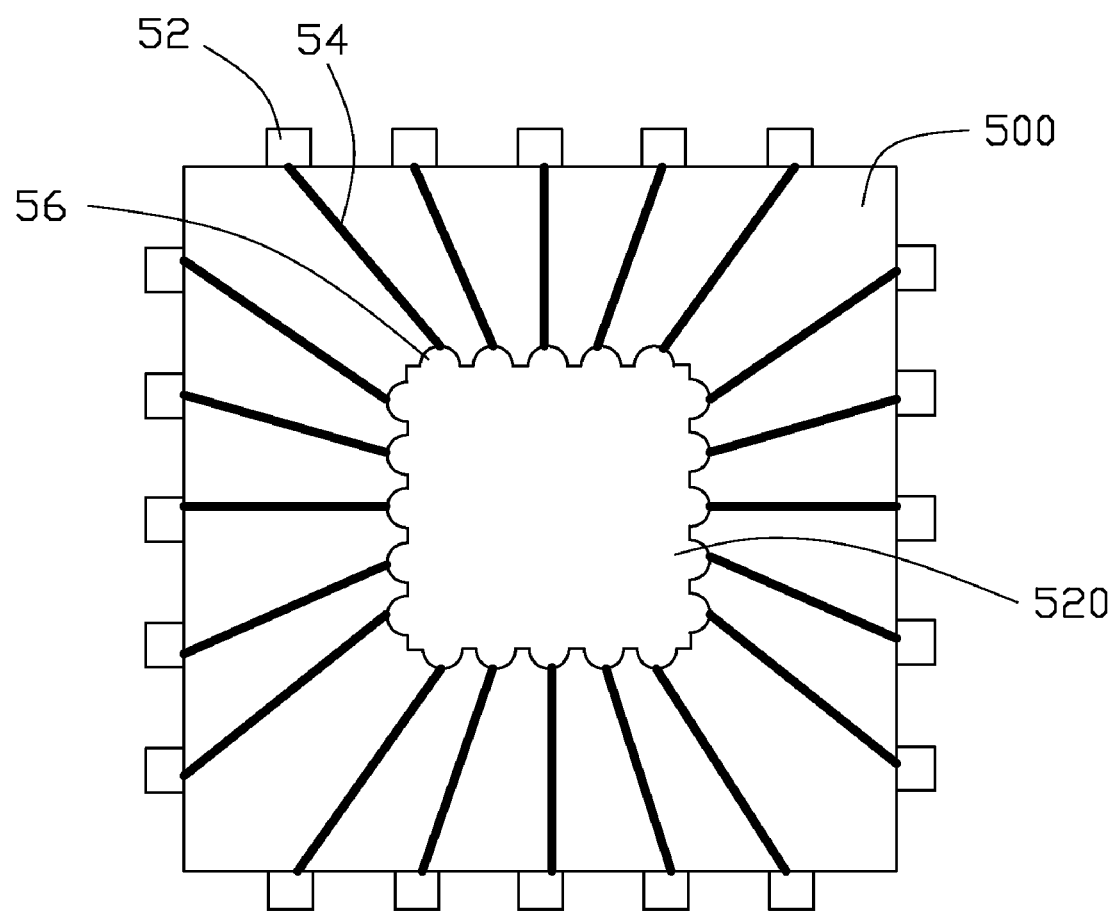
FIG. 6 is a schematic view of a second embodiment of a chip adapter.
Figure 7:
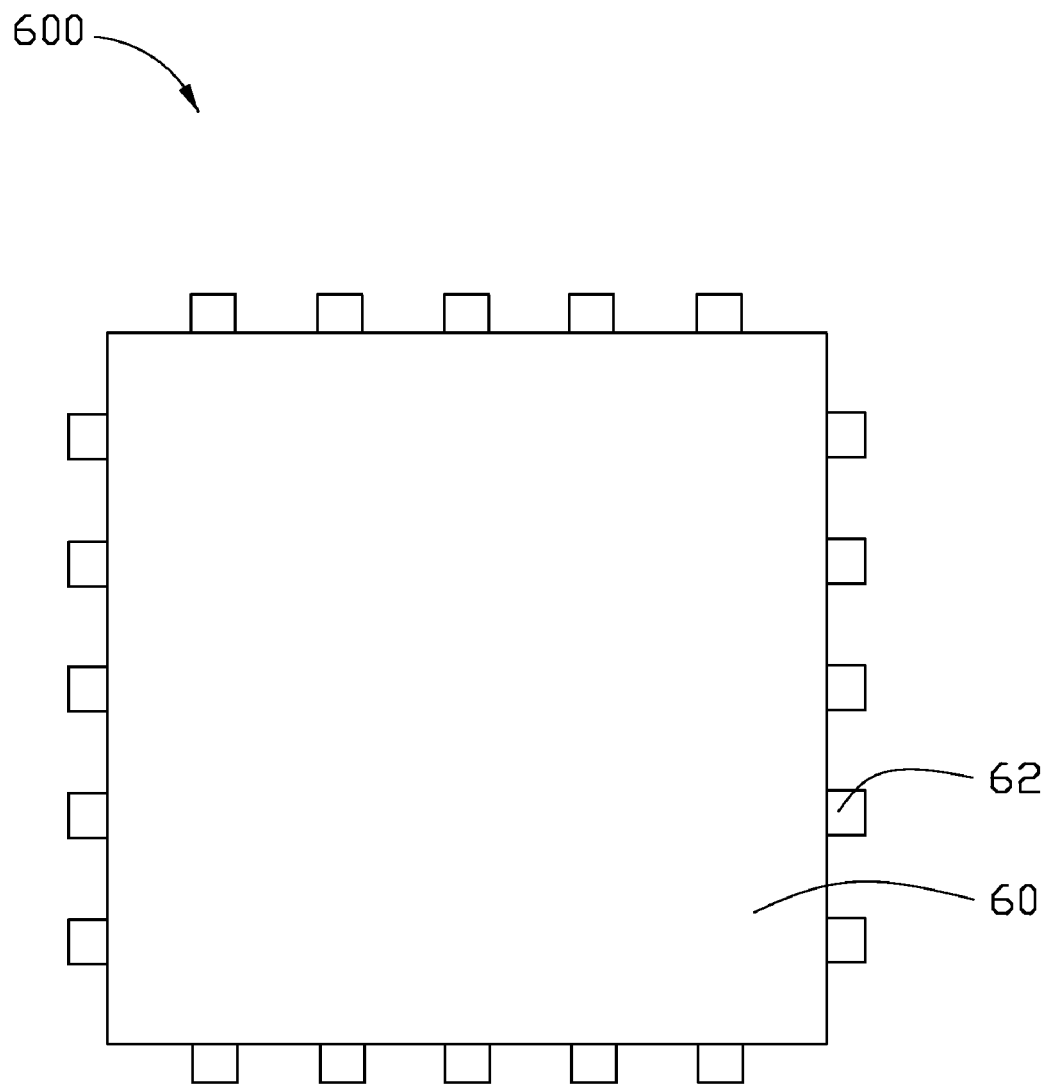
FIG. 7 is a schematic view of another chip.

Referring to FIGS. 5 to 7, a second embodiment of a chip adapter 500 is used to install a chip 600 on a chip arranging area 40 of a circuit board 400. The size of the chip 600 is greater than the size of the chip arranging area 40, namely the chip 600 cannot be installed on the chip arranging area 40 directly. A plurality of pads 42 are arranged around the chip arranging area 40 of the circuit board 400. A base 60 of the chip 600 extends a plurality of pins 62 corresponding to the plurality of pads 42 of the circuit board 400. The chip adapter 500 is a board of the same size as the base 60 of the chip 600. Edges of the chip adapter 500 extend a plurality of pads 52 corresponding to the plurality of pins 62 of the chip 600. A connecting opening 520 of the same size as the chip arranging area 40 of the circuit board 400 is defined in a center of the chip adapter 500. A plurality of semicircle gaps 56 are defined around the connecting opening 520 of the chip adapter 500, corresponding to the plurality of pads 42 of the circuit board 400. Each pad 52 is electrically connected to a sidewall of the corresponding gap 56, such as through the corresponding copper trace 54.

Figure 8:
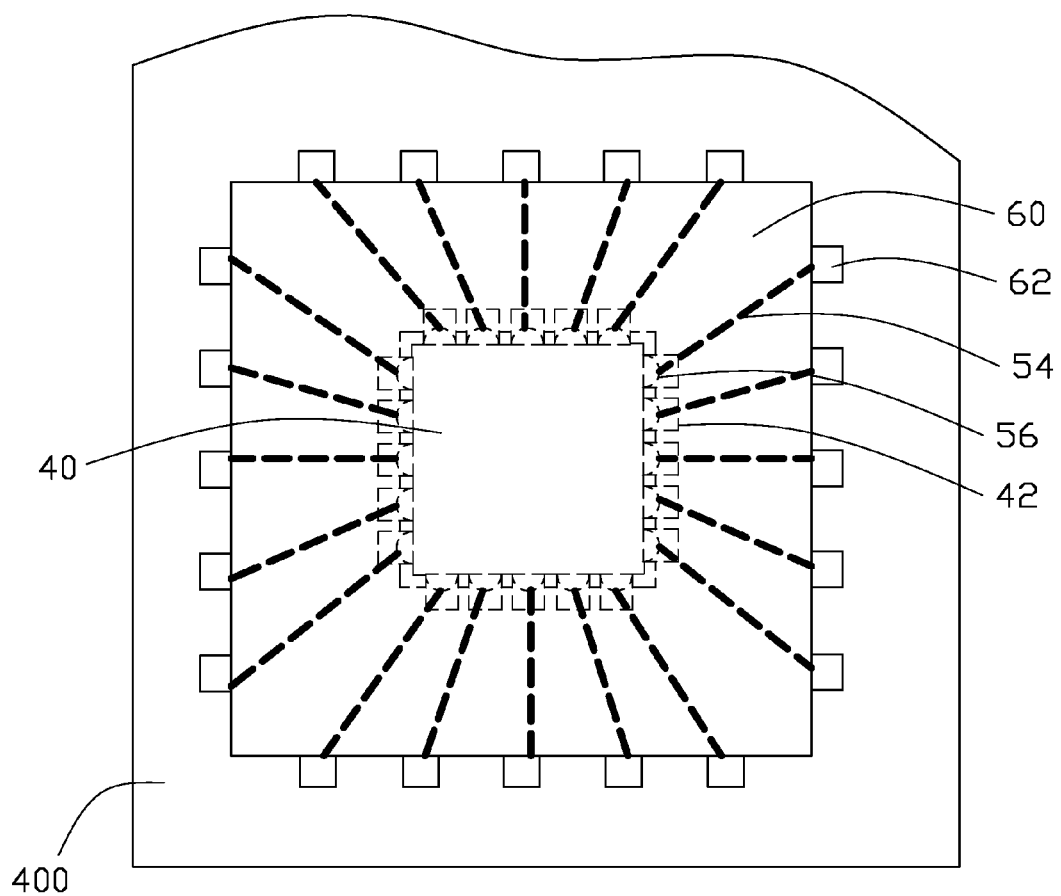
FIG. 8 is a schematic view of the circuit board of FIG. 5, using the chip of FIG. 7 installed using the chip adapter of FIG. 6.

Referring to FIG. 8, in use, the chip adapter 500 is placed on the chip arranging area 40 of the circuit board 400 and each gap 56 of the chip adapter 500 is corresponding to a pad 42 of the circuit board 400. The gaps 56 of the chip adapter 50 are soldered to electrically connect each pad 42 of the circuit board 400 to the corresponding copper trace 54. Therefore, each pad 42 of the circuit board 400 is electrically connected to the corresponding pad 52 of the chip adapter 500 by solder and the corresponding copper trace 54. The chip 600 is placed on the chip adapter 500, and each pad 62 of the chip 600 is soldered to the corresponding pad 52 of the chip adapter 500. As a result, each pad 42 of the circuit board 400 is electrically connected to the corresponding pad 62 of the chip 600 through the chip adapter 500, and the chip 600 functions normally with the circuit board 400.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A chip adapter used to install a chip on a first chip arranging area of a circuit board, the size of the chip being smaller than the size of the first chip arranging area of the circuit board, a plurality of first pads arranged around the first chip arranging area of the circuit board, the chip extending a plurality of pins corresponding to the plurality of first pads of the circuit board, the chip adapter comprising:

a board of the same size as the first chip arranging area of the circuit board;

wherein edges of the chip adapter define a plurality of gaps corresponding to the plurality of first pads of the circuit board, a second chip arranging area of the same size as the chip is arranged in a center of the chip adapter, a plurality of second pads are arranged around the second chip arranging area of the chip adapter corresponding to the plurality of pins of the chip, each of the plurality second pads is electrically connected to a sidewall of the corresponding gap of the chip adapter.

2. The chip adapter of claim 1, wherein each of the plurality second pads is electrically connected to the sidewall of the corresponding gap of the chip adapter through a copper trace.

3. The chip adapter of claim 1, wherein the plurality of gaps of the chip adapter are semicircle gaps.

4. A chip adapter used to install a chip on a chip arranging area of a circuit board, the size of the chip being greater than the size of the chip arranging area of the circuit board, a plurality of first pads arranged around the chip arranging area of the circuit board, the chip extending a plurality of pins corresponding to the plurality of first pads of the circuit board, the chip adapter comprising:

a board of the same size as the chip;

wherein edges of the chip adapter extend a plurality of second pads corresponding to the plurality of pins of the chip, a connecting opening of the same size as the chip arranging area of the circuit board is defined in a center of the chip adapter, a plurality of gaps are defined around the connecting opening of the chip adapter corresponding to the plurality of first pads of the circuit board, each of the plurality of second pads is electrically connected to a sidewall of the corresponding gap of the chip adapter.

5. The chip adapter of claim 4, wherein each of the plurality of second pads is electrically connected to a sidewall of the corresponding gap of the chip adapter through a copper trace.

6. The chip adapter of claim 4, wherein the plurality of gaps of the chip adapter are semicircle gaps.

* * * * *